United States Patent [19]

Yerman et al.

[11] Patent Number: 4,959,630
[45] Date of Patent: Sep. 25, 1990

[54] HIGH-FREQUENCY TRANSFORMER

[75] Inventors: Alexander J. Yerman, Scotia, N.Y.; Khai D. Ngo, Gainesville, Fla.

[73] Assignee: General Electric Company, Schenectady, N.Y.

[21] Appl. No.: 390,036

[22] Filed: Aug. 7, 1989

[51] Int. Cl.⁵ .................... H01F 15/02; H01F 27/28
[52] U.S. Cl. ................................ 336/83; 336/183; 336/200; 336/226; 336/232
[58] Field of Search ............. 336/180, 182, 183, 200, 336/206, 223, 225, 226, 232, 83

[56] References Cited

U.S. PATENT DOCUMENTS

| | | | |
|---|---|---|---|
| 2,851,765 | 9/1958 | Hanlet | 336/206 X |
| 2,921,165 | 1/1960 | Clarke | 336/226 X |
| 2,943,966 | 7/1960 | Leno et al. | 336/200 |
| 3,002,260 | 10/1961 | Shortt et al. | 336/200 X |
| 3,495,327 | 2/1970 | Eisler | 336/223 X |
| 3,634,632 | 1/1972 | Watson | 336/200 X |
| 4,651,254 | 3/1987 | Brede et al. | 336/200 X |

FOREIGN PATENT DOCUMENTS

| | | | |
|---|---|---|---|
| 151224 | 6/1937 | Austria | 336/223 |
| 1056272 | 4/1959 | Fed. Rep. of Germany | 336/200 |
| 1489053 | 5/1969 | Fed. Rep. of Germany | 336/223 |
| 61-184806 | 8/1986 | Japan | 336/225 |
| 665334 | 5/1979 | U.S.S.R. | 336/223 |
| 29274 | of 1913 | United Kingdom | 336/223 |
| 1094183 | 12/1967 | United Kingdom | 336/206 |

OTHER PUBLICATIONS

"Printed Circuit Coil", Styles, IBM Technical Disclosure Bulletin, vol. 15, No. 6/72, p. 19.

Primary Examiner—Thomas J. Kozma
Attorney, Agent, or Firm—Jill M. Breedlove; James C. Davis, Jr.; Marvin Snyder

[57] ABSTRACT

A high-frequency transformer is constructed from a flexible circuit comprising a primary conductive film winding and one or more secondary conductive film windings disposed on a single dielectric membrane. The flexible circuit is folded to form a stack of primary winding layers interleaved with secondary winding layers and then inserted into a magnetic cup core. The flexible circuit is preferably patterned photolithographically.

34 Claims, 5 Drawing Sheets

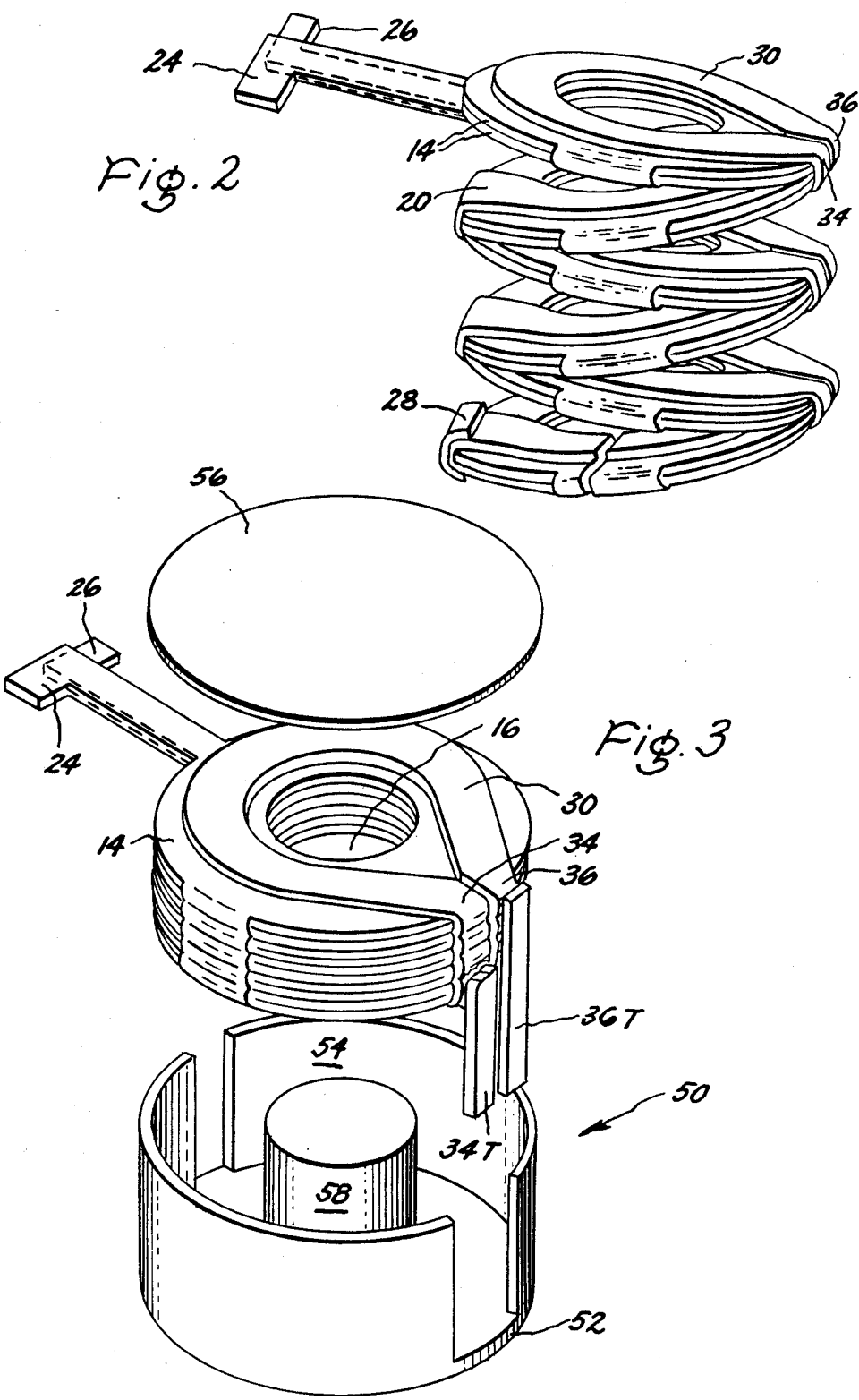

HIGH-FREQUENCY TRANSFORMER

FIELD OF THE INVENTION

The present invention relates generally to the field of transformers and, more particularly, to a conductive film, high-frequency transformer.

BACKGROUND OF THE INVENTION

As the frequency of operation of a magnetic component such as a transformer increases, the depth to which current penetrates the conductors comprising the transformer decreases. This penetration depth is referred to as "skin depth". At room temperature, copper has a skin depth $\delta$ measured in mils, equal to $2.60 \sqrt{1/f}$, where f represents frequency in Hertz. Thus, at a frequency of about 1 megahertz, current penetration in copper is only on the order of 2.6 mils. Consequently, if the conductors are more than several skin depths thick, then any portion of the conductors which is farther than 3 skin depths or $3\delta$ from the exterior surface is not involved in carrying the transformer currents. For high frequency operation, inactive conductive material adds to the weight and volume of the transformer without enhancing its operational characteristics. Therefore, it is desirable to make magnetic components, such as transformers, as small as possible. To this end, planar conductive films are used which have a thickness on the order of twice the skin depth at the intended operating frequency of the magnetic component's conductors. These conductive films are normally disposed on a dielectric membrane and patterned to provide the desired winding configuration. Multiturn windings normally comprise either a single layer spiral or a stack of layers of individual conductive films on dielectric substrates which are interconnected layer-to-layer with soldered connecting bars to provide a continuous winding. Spiral windings are limited in the number of turns they can provide for high currents, and multilayer windings have the disadvantage of requiring a number of layer-to-layer connections which increases with the number of turns in the winding. The process of connecting thin conductive layers in layer-to-layer fashion with connecting bars, which are soldered to the edge of the conductor, is exacting and tends to have a poor yield since the solder can easily shortcircuit layers or fail to connect a layer or layers, either situation resulting in an inoperative winding.

Copending U.S. patent application Ser. No. 359,063 of K. D. T. Ngo and A. J. Yerman, filed on May 30, 1989 and assigned to the instant assignee, which is hereby incorporated by reference, describes a conductive film magnetic component having a pattern which, when folded in an accordion-like manner, produces a multiturn winding for which layer-to-layer connections are built into the pattern of the conductive film and the folding thereof. Dielectric material spaces apart adjacent layers of the folded conductive film in order to prevent unintended connections between the different layers. The winding of the cited patent application may comprise either an inductor or the primary winding of a transformer. For a transformer, a secondary winding is provided by patterning a conductive film and a dielectric substrate such that folding the dielectric substrate results in a multilayer stack of two-turn, center-tapped windings. These center-tapped windings are connected in parallel to form the secondary winding which is interleaved with the hereinabove described primary winding to form a transformer. Such a transformer structure is less complex to manufacture and assemble than prior art conductive film transformers and is more reliable.

As a further improvement over the prior art, it is desirable to provide a thin film, high-frequency transformer for which the primary winding and one or more secondary windings are constructed as part of the same flexible circuit comprising conductive films and dielectric material, the pattern of which, when folded, provides a complete and compact transformer assembly

OBJECTS OF THE INVENTION

Accordingly, it is an object of the present invention to provide a thin film, high-frequency transformer for which the primary winding and one or more secondary windings are constructed from a single flexible circuit comprising conductive films and dielectric material Another object of the present invention is to provide a high-frequency transformer comprising conductive films patterned on a dielectric membrane in such manner that folding of the membrane results in a multiturn, multilayer transformer assembly having a primary winding and one or more secondary windings.

Still another object of the present invention is to provide a method for fabricating a thin film, multiturn, multilayer transformer from a single flexible circuit, which comprises conductive films and dielectric material, without the need for individual connections separately applied to each layer.

SUMMARY OF THE INVENTION

The foregoing and other objects of the present invention are achieved in a high-frequency transformer constructed from a single flexible circuit comprising conductive films and dielectric material. In the preferred embodiment, a dielectric membrane initially disposed in a plane has first and second major surfaces. A primary conductive film of serpentine configuration is disposed on each major surface of a first portion of the dielectric membrane. One pair of corresponding ends of the primary conductive films are connected in series, and the other pair of corresponding ends are unconnected to form primary terminals, so that a continuous, serpentine primary winding is formed.

The secondary winding is formed on the first major surface of a second portion of the dielectric membrane The secondary winding comprises a plurality of pairs of single-turn windings, the single-turn windings comprising each pair being connected in parallel to form a generally figure-eight configuration with a vertical slit, or insulating gap, in the crossbar, or horizontal midline, thereof, thus forming two terminals for electrical connections. This particular secondary winding pair configuration is hereinafter referred to as a "slit figure-eight".

Another embodiment of a secondary winding useful in a transformer of the present invention comprises a plurality of center-tapped, two-turn windings, each having a generally figure-eight configuration, connected in parallel.

The primary and secondary conductive films on the first major surface of the dielectric membrane are coated or covered with a dielectric material in order to insulate conductive films from each other, the purpose for which will become apparent from the ensuing description of transformer assembly.

The transformer is formed first by folding the dielectric membrane lengthwise between the primary and secondary conductive films so that the primary conductive film on the second major surface of the first portion of the dielectric membrane is in contact with the second major surface of the second portion of the dielectric membrane. Next, the circuit is accordion-folded, or z-folded, to form a stack of layers so that the terminals of each secondary conductive film face outwardly from the stack. As used herein, a layer is defined as consisting of a dielectric membrane having conductive films disposed on both surfaces thereof and any additional dielectric coating thereon. The secondary terminals are connected in parallel using conductive solder bars. By z-folding the flexible circuit as described, the resulting transformer is comprised of a stack of interleaved primary and secondary winding turns, the primary winding and the secondary winding each having one turn per layer in the preferred embodiment.

A transformer having more than one secondary winding is also provided by the present invention. For example, for a transformer comprising two secondary windings, the dielectric membrane is divided into three portions. In one embodiment, a primary winding is disposed on the middle portion, and two secondary windings, each comprising a plurality of slit figure-eight windings connected in parallel, are disposed on the outer portions of the dielectric membrane. The secondary windings, however, are disposed vertically offset from each other by one turn. For this configuration, a dielectric coating, which provides insulation between layers of the stack after folding, is needed only on the secondary conductive films. Two lengthwise folds are made at the junctions between the three portions of the dielectric membrane so that there is a secondary winding on the top and bottom of the resulting intermediate stack. The membrane is then z-folded so that the terminals of both of the secondary windings are disposed outwardly from the stack. The terminals of the conductive films comprising each secondary winding are connected in parallel, preferably by solder bars.

Alternatively, a transformer comprising two secondary windings may be constructed by situating the primary winding on an outer portion of the dielectric membrane. For this embodiment, each one of a plurality of two-turn, center-tapped secondary windings is disposed orthogonally with respect to the primary winding such that one turn of each winding is disposed on the central portion and the second turn is disposed on the other outer portion of the dielectric membrane. A first lengthwise or vertical fold is made between the primary portion and the central, secondary portion of the flexible circuit so that the primary conductive film on the second major surface of the first portion of the dielectric membrane is in contact with the second major surface of the central portion of the dielectric membrane. A second lengthwise fold is then made to wrap the outer secondary portion around the resulting intermediate stack so that the secondary turns on the outer secondary portion of the dielectric membrane face upwardly therefrom. Next, the flexible circuit is z-folded to form a stack of layers with the terminals of the secondary winding exposed. The corresponding secondary terminals are connected in parallel using solder bars.

BRIEF DESCRIPTION OF THE DRAWINGS

The features and advantages of the present invention will become apparent form the following detailed description of the invention when read with the accompanying drawings in which:

FIG. 2 is a perspective view illustrating the technique of z-folding the flexible circuit of FIG. 1;

FIG. 3 is an exploded, perspective view of the windings of FIG. 2 in a magnetic cup core to form a transformer according to the present invention;

DETAILED DESCRIPTION OF THE INVENTION

Figure 1:
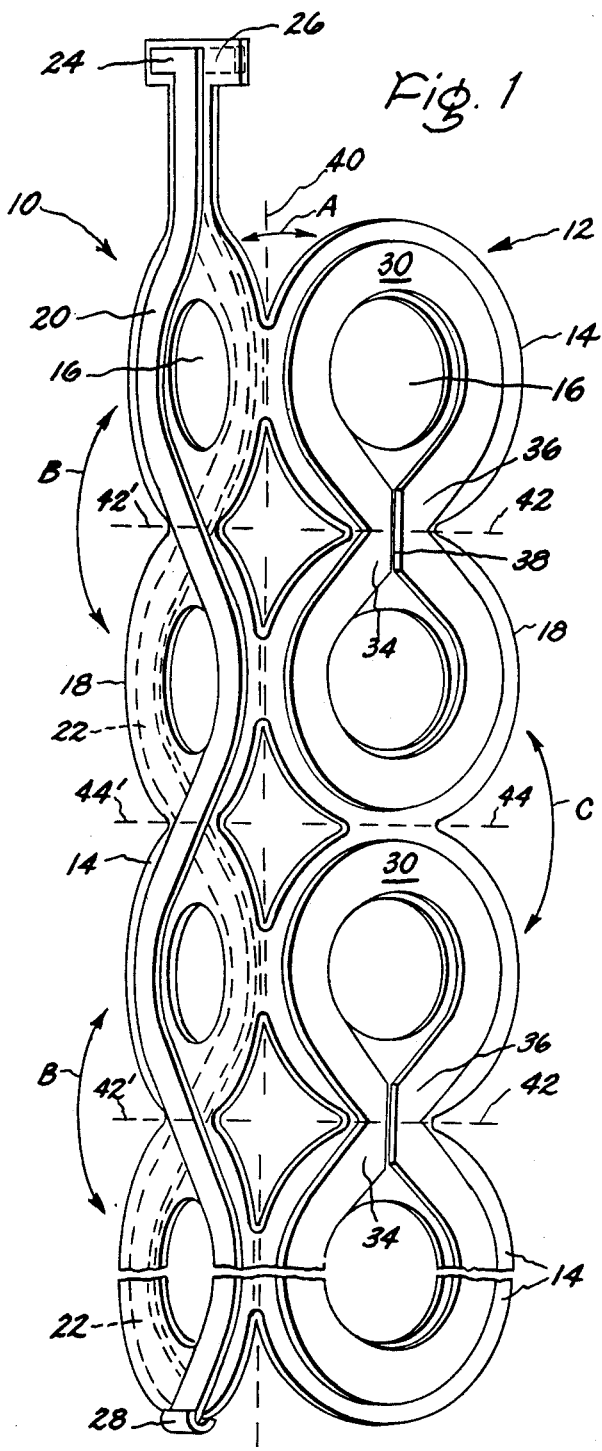
FIG. 1 is a dimensional illustration showing the direction of folds made in a flexible circuit comprising one embodiment of a transformer in accordance with the present invention.

FIG. 1 illustrates a flexible circuit comprising a primary winding 10 and a secondary winding 12 disposed on a a dielectric membrane 14 as a first fold is being made during construction of a transformer according to the present invention. Dielectric membrane 14 has a plurality of apertures 16 therein and an undulatory exterior boundary 18. As shown, the flexible circuit is divided into two portions; the first or left portion comprises primary winding 10, and the second or right portion comprises secondary winding 12.

Primary winding 10 comprises primary conductive films 20 and 22 of uniform thickness disposed on the upper and lower surfaces of dielectric membrane 14, respectively. Primary conductive film 20 has a terminal end 24 and a generally serpentine configuration which weaves about apertures 16. Conductive film 20 preferably has a uniform width to provide a constant current density along the length thereof. Primary conductive film 22 on the lower surface of dielectric membrane 14 has a terminal end 26 and a generally serpentine configuration which weaves about apertures 16 in an opposed manner with respect to that of primary conductive film 20. A connection 28 is made between primary conductive films 20 and 22, thus forming a continuous winding. Preferably, conductive film 22 has the same uniform width as conductive film 20 to maintain a constant current density along the length of the continuous, serpentine primary winding 10.

Connection 28 is preferably made by soldering a thin conductive foil to conductive films 20 and 22. To preserve constant current density, the width of the foil is the same as, or slightly greater than, that of the primary conductive films, and the thickness is the same. Other suitable methods for connecting the conductive films may be employed. For example, an alternative method includes the steps of: (1) depositing or laminating films 20 and 22 as a single continuous film; (2) forming a via hole or holes through dielectric membrane 14 at the location of the connection; and (3) plating the via hole or holes to connect films 20 and 22. The current path for the primary winding, e.g. beginning from terminal 24, is along conductive film 20 and back to terminal 26 along conductive film 22.

Secondary winding 12, illustrated in FIG. 1 as being situated on the second or right-hand portion of dielectric membrane 14 comprises a plurality of pairs of parallel-connected, single-turn windings, the parallel-connected pairs in turn being connected in parallel during transformer assembly, as described hereinafter. Specifically, in the preferred embodiment as shown in FIG. 1, each pair of single-turn windings comprises a secondary conductive film 30 of uniform thickness and width having a slit figure-eight configuration which is disposed on the upper surface of the right-hand portion of dielectric membrane 14. Each secondary conductive film 30 has terminals 34 and 36 separated from each other by a vertical slit comprising an insulating gap 38. Preferably, the width of each secondary conductive film is substantially equal to that of the primary conductive films in order to maintain constant current density. The current path in each secondary conductive film 30 is from one terminal 34 (or 36), around the upper and lower circular portions of the slit figure-eight, to the other terminal 36 (or 34).

As will be appreciated by those of skill in the art, the lengths of the primary and secondary windings depend on the desired number of turns. Additionally, it is to be The primary and secondary windings configured as described hereinabove and disposed in the dielectric membrane to form a single flexible circuit are folded in a particular manner in order to construct a transformer according to the present invention. The particular manner of folding the flexible circuit is referred to he in as accordion-folding or z-folding. Before z-folding the flexible circuit, however, it is necessary to apply a dielectric material (not shown, for simplicity of illustration) to the upper surface of the flexible circuit (as viewed in FIG. 1) in order to provide insulation between conductive films the purpose for which will become clear in the ensuing description of z-folding. Initially, the two portions of dielectric membrane 14 are folded together at a fold line 40 as directed by arrow A shown in FIG. 1 such that the lower surfaces of each of the two portions of the flexible circuit are in contact with each other, and such that corresponding fold lines 42 and 42' coincide with each other and corresponding fold lines 44 and 44' coincide with each other. The flexible circuit then may be z-folded to form a stack of winding layers having an axis extending substantially longitudinally therethrough with primary terminals 24 and 26 either at the top or bottom of the stack. Assume for illustrative purposes that terminals 24 and 26 are at the top of the stack. To z-fold the flexible circuit, the flexible circuit is folded at fold lines 42 and 42' as directed by arrows B and at fold lines 44 and 44' as directed by arrow C. (In effect, for illustrative purposes, fold lines 41 and 42' come upwardly out of the plane of the paper, and fold lines 44 and 44' go downwardly into the plane of the paper.)

FIG. 2 illustrates a partially z-folded flexible circuit, thus showing how primary conductive films are interleaved with secondary conductive films 30. Primary conductive films 22 are not visible in FIG. 2, but it is apparent from FIG. 1 that films 22 are on the underside of dielectric membrane 14. In particular, for the stack shown in FIG. 2, there are a single primary winding turn per layer and a single secondary winding turn per layer in the stack. In addition, as illustrated, secondary terminals 34 and 36 are exposed so that they may be connected in parallel, the parallel connections to be described hereinafter. In the stack of winding portion layers of FIG. 2, the lower surface of the secondary portion of dielectric membrane 14, as viewed in FIG. 1, insulates secondary conductive films 30 from primary conductive films 22. Further, the additional dielectric layer (not shown) applied to the upper surface of the flexible circuit, as viewed in FIG. 1, insulates successive half turns of the primary conductive film 20 from each other and also insulates successive turns of adjacent secondary conductive films 30 from each other.

FIG. 3 illustrates in in exploded, perspective view, a step-down transformer comprising the z-folded flexible circuit of FIG. 2 within a magnetic cup core 50. Secondary conductive films 30 are connected in parallel using solder bars or terminal strips 34T and 36T in order to provide a high current capacity, single-turn secondary winding. In particular, a first terminal strip 34T is soldered to terminal 34 of each of secondary conductive films 30, and a second terminal strip 36T is soldered to terminal 36 of each of secondary conductive films 30.

Magnetic cup core 50 has a lower disk-shaped wall or cap 52, a vertically extending sidewall 54, and an upper disk-shaped wall or cap 56. Cup core 50 further includes a central post 58 which extends through each aperture 16 in dielectric membrane 14 on which the primary and secondary conductive films are disposed. As illustrated, sidewall 54 has a first aperture therein through which primary terminals 24 and 26 extend, and a second aperture through which secondary terminal strips 34T and 36T extend. With upper cap 56 in place in direct contact with sidewall 54 and central post 58, a single magnetic structure, i.e. cup core 50, encloses the transformer's interleaved primary and secondary windings.

An exemplary membrane thickness is between about 1-3 mils, and an exemplary conductive film thickness is between about 0.1-3 mils. As described hereinabove, thickness depends upon skin depth, and hence, operating frequency. In general, the frequency range of operation of a transformer of the present invention is from about 1 megahertz to above 10 megahertz. For a 5 megahertz transformer, for example, a dielectric membrane 14 and dielector overcoat each comprise a 2 mil thick polyimide film, such as that sold under the trademark Kapton by E. I. du Pont deNemours and Company; and the conductive films are comprised of 1.3 mils thickness of copper on each side of the dielectric membrane. The width of the conductive films depends upon the current requirements for the particular application.

Figure 4:
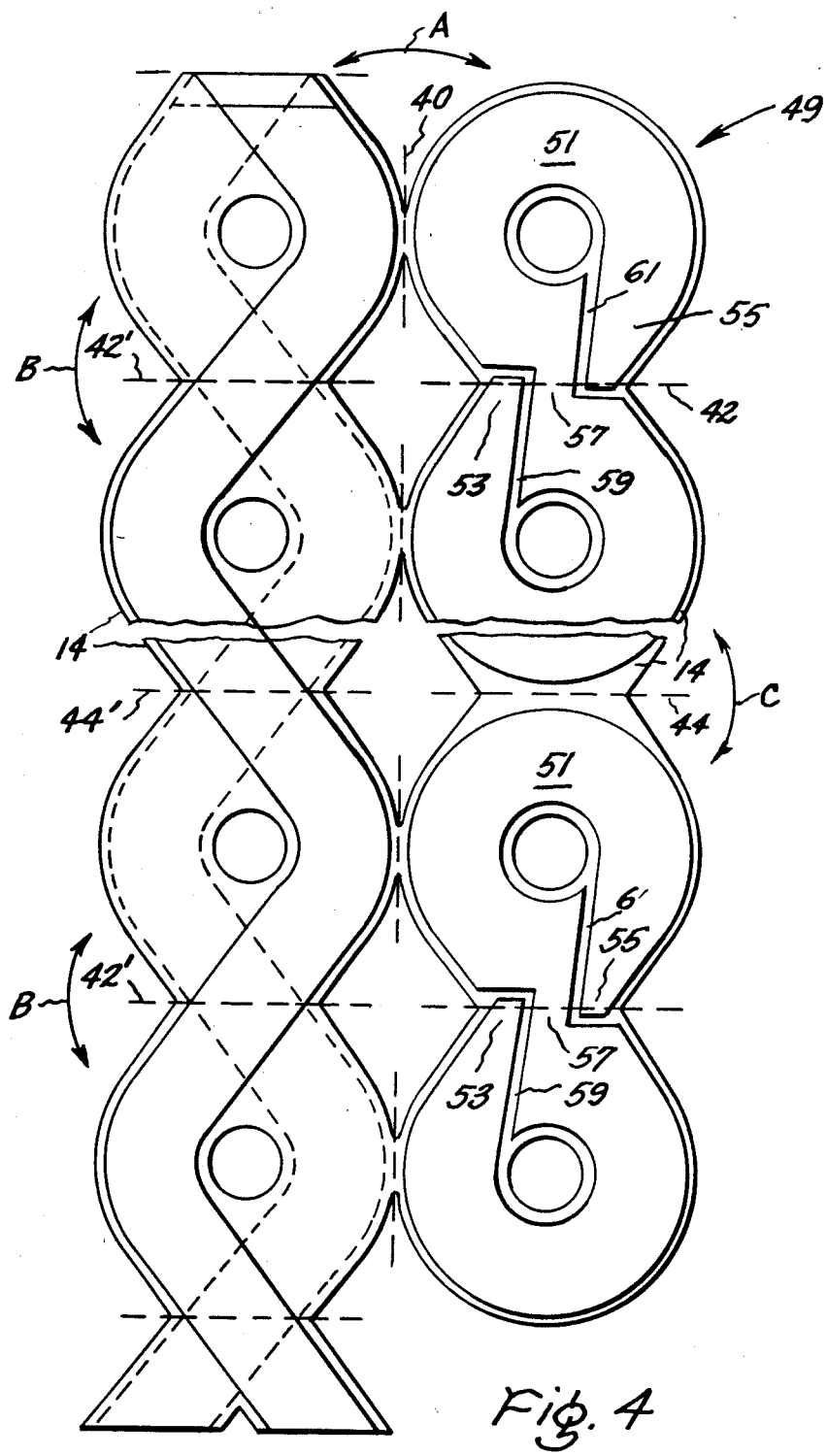
FIG. 4 is a plan view illustrating another embodiment of a flexible circuit comprising a transformer according to the present invention.

FIG. 4 illustrates another embodiment of a flexible circuit according to the present invention wherein a center-tapped secondary winding 49 is employed. Secondary winding 49 comprises a plurality of uniformly thick conductive films 51, each of which comprises a two-turn center-tapped winding having a substantially figure-eight configuration. Each center-tapped winding 51 has end terminals 53 and 55 and a center-tapped terminal 57. The terminals are separated from each other by insulating gaps 59 and 61. Preferably, terminals 53, 55 and 57 have substantially equal widths. Furthermore, although these terminal portions are shown as being narrower than the circular portions, or turns, of conductive films 51, they may be made wider by increasing the width of the figure-eight at the crossbar, or horizontal midline, thereof. In general, to maintain substantially constant current density, it is desirable that each secondary conductive film have a substantially uniform width which is equal to that of the primary conductive films.

A transformer is assembled from the flexible circuit of FIG. 4 in similar fashion to that of FIG. 1. That is, a first fold is made along fold line 40 as directed by arrow A; and then the flexible circuit is z-folded by folding according to the direction of arrows B and C so that corresponding fold lines 42 and 42' coincide, as described in detail hereinabove with respect to FIG. 1. After z-folding, corresponding terminals 53, 55 and 57 of each secondary conductive films 51 are connected in parallel using solder bars (not shown). The completed winding assembly is then inserted into a magnetic cup core, preferably like magnetic cup core 50 of FIG. 3.

Figure 5:
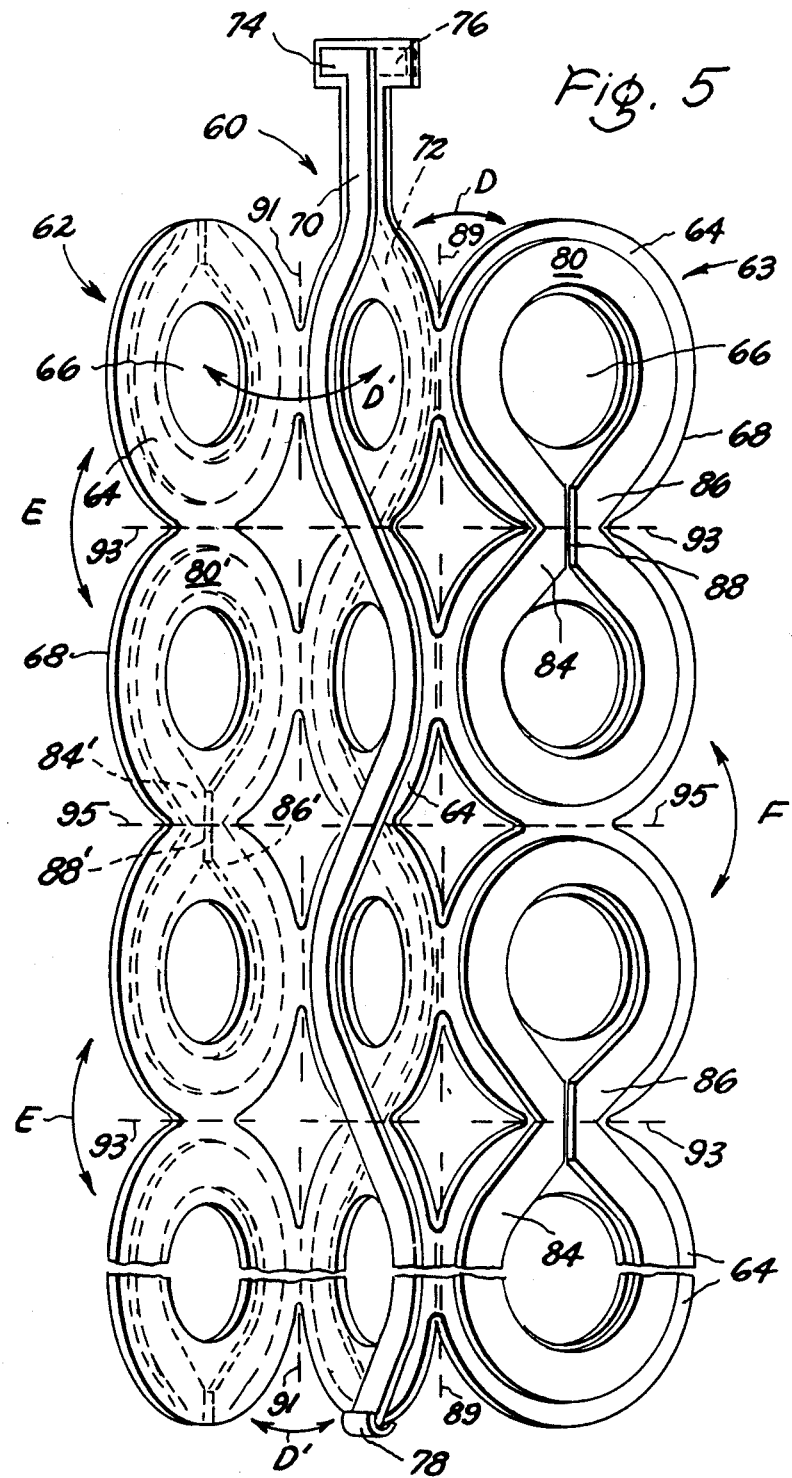
FIG. 5 is a dimensional illustration showing the direction of folds made in a flexible circuit comprising the primary winding and two secondary windings of another embodiment of a transformer according to the present invention.

For many applications, it is desirable to employ a transformer having more than one secondary winding. FIG. 5 is a dimensional view of a partially folded flexible circuit comprising a primary winding 60 and two secondary windings 62 and 63 for such a transformer constructed in accordance with one embodiment the present invention. A dielectric membrane 64, which includes apertures 66 and an undulatory boundary 68, is divided into three portions, each comprising one of the transformer windings. Primary winding 60 is preferably situated in the central portion and like primary winding 10 of FIG. 1, comprises serpentine conductive films 70 and 72 disposed on the upper and lower major surfaces, respectively, of dielectric membrane 64. Primary conductive films 70 and have terminal ends 74 and 76, respectively, and are connected at their ends opposite the terminal ends by a connector at location 78 to form a single, continuous winding 60.

In the embodiment of FIG. 5, secondary windings 62 and 63 are situated on either side of primary winding 60. Each secondary winding 62 and 63, respectively, comprises a plurality of pairs of parallel-connected, single-turn windings, the parallel-connected pairs in turn being connected in parallel during transformer assembly, as described hereinafter. Specifically, in the preferred embodiment as shown in FIG. 5, each pair of single-turn windings comprises a secondary conductive film 80, and 80', respectively, having a slit figure-eight configuration disposed on the upper and lower surfaces, respectively, of dielectric membrane 64. Each secondary conductive film 80 has terminals 84 and 86 separated from each other by a vertical slit comprising an insulating gap 88. Similarly, each secondary conductive film 80' was terminals 84' and 86' separated from each other by an insulating gap 88'.

As shown in FIG. 5, secondary windings 62 and 63 are offset vertically from each other by one turn of conductive film 80 and 80' in order to interleave primary winding 70 with the two secondary windings such that the individual windings comprising each secondary winding can be connected in parallel upon formation of the stack. Initially, before folding, a dielectric overcoat (not shown) must be applied to secondary windings 62 and 63 for insulating secondary turns from each other. Dielectric membrane 64 is first folded along lines 89 and 91 as directed by arrows D and D', respectively, in FIG. 5. The flexible circuit is then z-folded along foldlines 93 and 95 as directed by arrows E and F, respectively, so that secondary terminals 84, 86, 84' and 86' are exposed. Corresponding terminals 84 and 86 and corresponding terminals 84' and 86' are respectively connected in parallel by solder bars in the same manner as terminals 34 and 36 of secondary winding 12 of FIG. 3. By thus offsetting the turns of the secondary windings 62 and 63, secondary terminals 84 and 86 are disposed diametrically oppositely to terminals 84' and 86' in the stack. The stack of interleaved windings is inserted into a magnetic cup core, such as the one shown in FIG. 3.

Figure 6:
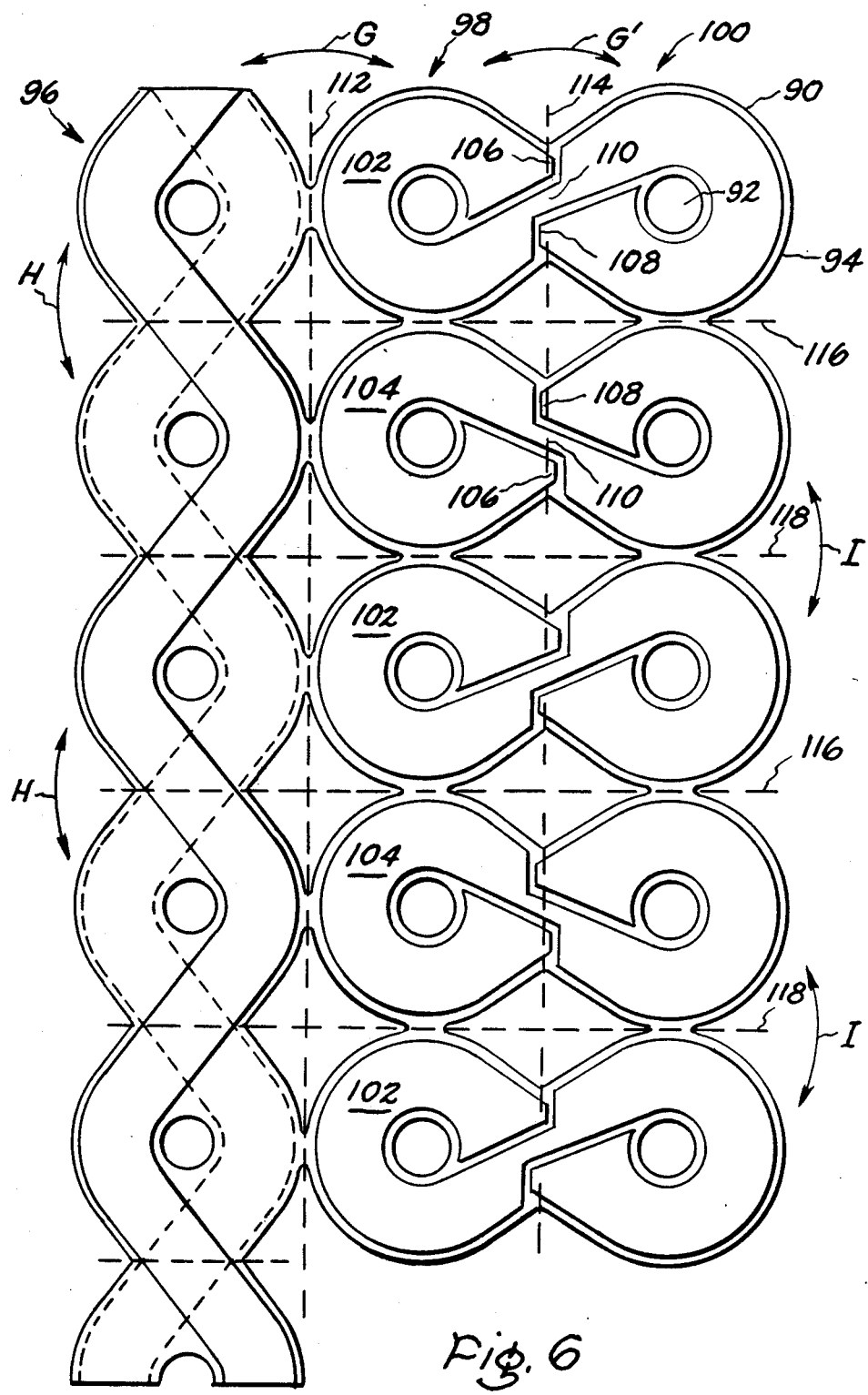
FIG. 6 is a plan view illustrating another embodiment of a flexible circuit prior to folding to form a transformer according to the present invention.

Another embodiment of a flexible circuit comprising two secondary windings is illustrated in FIG. 6. Similar to the embodiment of FIG. 5, a dielectric membrane 90, including apertures 92 and an undulatory boundary 94, is divided into two outer portions and a central portion. However, in the embodiment of FIG. 6, a primary winding 96 is disposed on one outer portion, and secondary windings 98 and 100 are disposed on the central and second outer portion of dielectric membrane 90, respectively. In this embodiment, secondary windings 98 and 100 together comprise a plurality of two-turn center-tapped secondary conductive films 102 and 104, each having a substantially figure-eight configuration. Prior to folding, conductive films 102 and 104 extend in a direction normal to the extent of primary winding 96 so that the turns on the central portion or dielectric membrane 90 each comprise one turn of secondary winding 98, and the turns on the second outer portion of dielectric membrane 90 each comprise one turn of secondary winding 100. Each respective one of secondary conductive films 102 and 104 has two end terminals 106 and 108 and a center-tapped terminal 110. Preferably, as shown, adjacent conductive films 98 and 100 are disposed on dielectric membrane 90 as mirror images of each other, the reason for which shall become clear in the ensuing description of transformer assembly.

Initially, dielectric membrane 90 is folded along line 112 as directed by arrow G so that the portion of primary winding 96 on the second major surface of dielectric membrane 90 is in contact with the second major surface of the central portion of dielectric membrane 90. A second vertical fold is made along line 114 as directed by arrow G', wrapping the flexible circuit around so that secondary winding 100 is situated on top of the resulting intermediate stack. The flexible circuit is then z-folded as directed by arrows H and I along fold lines 116 and 118, respectively. (In effect, fold lines 116 come upwardly out of the plane of the paper, and fold lines 118 go downwardly into the plane of the paper.)

Advantageously, for the embodiment of FIG. 6, no additional dielectric material is needed for insulation other than dielectric membrane 90. That is, turns of secondary windings 98 and 100 are insulated from turns of primary winding 96 by dielectric membrane 90 when folded by wrapping as hereinabove described. Moreover, adjacent conductive films 102 and 104 are arranged as mirror images of each other, so that there is the same potential gradient from terminal to terminal of the contacting turns.

Corresponding secondary terminals 106, 108 and 110 of each secondary conductive film are connected in parallel using solder bars (not shown). Advantageously, for this embodiment, all secondary terminals are on the same side of the stack after folding so that only three solder bars are needed. The assembled winding is then inserted into a magnetic cup core, such as magnetic cup core 50 of FIG. 3, in order to complete the transformer assembly. The particular flexible circuit of FIG. 6 results in a 5:1:1 turn ratio, but this may be varied, as desired, as will be obvious to those of ordinary skill in the art.

One method of fabricating transformer windings of the present invention involves photolithography. According to this method, a thin composite sheet is provided comprising a dielectric membrane which has separate conductive films disposed on the upper and lower surfaces thereof. A thin film photoresist, such as Laminar, which is manufactured by the Dynachem Division of Morton Thiokol, Inc., is applied to both sides of the composite sheet. The composite sheet is then exposed photolithographically through suitable masks so that the conductive films, for example comprising copper, may be etched or removed where it is desired to pattern the dielectric membrane. Next the photoresist is removed, and the dielectric membrane is etched while using the remaining copper as a mask. The dielectric membrane, for example comprising Kapton polyimide film, may be: (1) plasma etched in a mixture of oxygen and CF4; (2 etched using a concentrated hot caustic solution;or (3) etched using aqueous solutions of organic bases such as hydrazine and ethylenediamine as described in Saiki et al. U.S. Pat. Nos. 4,113,440 and $\propto$,218,283, are hereby incorporated by reference. After etching the Kapton polyimide membrane to determine its final pattern, the composite is again laminated with the photoresist and exposed through a mask which determines the final pattern of the conductive film. The copper is then etched using any well known copper etchant, such as ferric chloride at 60° C.

An alternative method of fabricating transformer windings according to the present invention may comprise etching copper to pattern the conductive films and then die blanking the Kapton polyimide membrane.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A transformer, comprising:
  a dielectric membrane having first and second major surfaces;
  a primary winding comprising a primary conductive film disposed on each of the first and second major surfaces, respectively, of a first portion of said dielectric membrane, each said primary conductive film having a substantially serpentine configuration along a predetermined direction when disposed in a plane, said primary conductive films on the first and second major surfaces of said dielectric membrane being connected in series at one end to form said primary winding;
  at least one secondary winding, each said secondary winding comprising a plurality of separate secondary conductive films electrically connected together, said secondary winding being disposed on the first major surface of a second portion of said dielectric membrane; said dielectric membrane being folded to form a stack of layers having an axis extending substantially longitudinally through said stack, said primary winding and said secondary winding each comprising a plurality of turns which encircle said axis and which are interleaved in said stack.

2. The transformer of claim 1 wherein said primary conductive films have substantially equal, uniform 3. The transformer of claim 1 wherein each said secondary conductive film, when disposed in a plane, has a substantially figure-eight configuration with a vertical slit extending through the horizontal midline thereof so as to form two electrical terminals insulated from each other.

4. The transformer of claim 3 wherein said secondary conductive films have substantially equal, uniform widths.

5. The transformer of claim 3 wherein said primary conductive films and said secondary conductive films have substantially equal, uniform widths.

6. The transformer of claim 1 wherein each said secondary conductive film has a substantially figure-eight configuration, each said secondary conductive film comprising two end terminals and a center-tapped terminal separated from each other by first and second vertical insulating gaps at the horizontal midline of the figure-eight.

7. The transformer of claim 6 wherein said secondary conductive films have substantially equal, uniform widths.

8. The transformer of claim 6 wherein said primary conductive films and said secondary conductive films have substantially equal, uniform widths.

9. The transformer of claim 1 wherein the other ends of said primary conductive films are at a side of the primary winding opposite to the side of said primary winding at which said series-connected ends are situated, said other ends of said primary conductive films serving as terminals for said primary winding.

10. The transformer of claim 1 wherein the series connection at one end of said primary conductive films comprises a continuation of said primary conductive film on the first and second major surfaces of said dielectric membrane so that said primary winding comprises a single continuous conductive film.

11. The transformer of claim 1 wherein the series connection at one end of said primary conductive films comprises additional conductive material connecting said primary conductive film on the first major surface of said dielectric membrane to said primary conductive film on the second major surface of said dielectric membrane.

12. The transformer of claim 1 wherein the series connection at one end of said primary conductive films comprises additional conductive material disposed in an aperture in said dielectric membrane and connected to said primary conductive films on the first and second major surfaces of said dielectric membrane.

13. The transformer of claim 1 wherein said secondary conductive films are connected in parallel.

14. The transformer of claim 6 wherein said secondary conductive films are connected in parallel.

15. The transformer of claim 1 including an additional dielectric material disposed between adjacent layers of said stack so as to insulate said adjacent layers from each other.

16. The transformer of claim 15 wherein said dielectric material comprises a coating on said conductive films which are disposed on the first major surface of said dielectric membrane.

17. The transformer of claim 15 wherein said dielectric material comprises a second dielectric membrane disposed over said conductive film on the first major surface of said dielectric membrane.

18. The transformer of claim 1 wherein the folding of said dielectric membrane includes:
  a first fold along a second axis separating the first and second portions of said dielectric membrane so as to place the second major surface of the second portion in contact with the second major surface of the first portion, said primary conductive film on the second major surface of the first portion being insulated from said secondary winding by said dielectric membrane; and further folds of said dielectric membrane along axes normal to said second axis in an accordion-like manner with successive folds being made in directions opposite to each other.

19. The transformer of claim 18 further comprising a magnetic core, said magnetic core comprising:
   top and bottom magnetic wall disposed respectively adjacent upper and lower surfaces of said stack of layers;
   a central magnetic member extending between said top and bottom walls and through an aperture in said stack; and
   a peripheral magnetic wall extending between said top and bottom walls.

20. The transformer of claim 1, further comprising a second secondary winding disposed on a third portion of said dielectric membrane, the third portion of said dielectric membrane being electrically insulated from the first and second portions thereof.

21. The transformer of claim 20 wherein the first portion of said dielectric membrane comprises a central portion thereof, and the second and third portions of said dielectric membrane comprise outer portions thereof.

22. The transformer of claim 21 wherein each said secondary conductive film has a substantially figure-eight configuration with a vertical slit extending through the horizontal midline thereof so as to form two electrical terminals insulated from each other said secondary conductive films being connected in parallel, adjacent layers of said stack being insulated from each other by a dielectric material disposed therebetween.

23. The transformer of claim 20 wherein the first portion of said dielectric membrane comprises a first outer portion thereof, and the second and third portions of said dielectric membrane respectively comprise a central portion and a second outer portion, respectively, thereof.

24. The transformer of claim 23 wherein each said secondary conductive film has a subtantially figure-eight configuration, each said secondary conductive film comprising substantially two turns and being disposed in a direction normal to the predetermined direction of said primary conductive films, each said secondary conductive film having two end terminals and a center-taped terminal separated from each other by two insulating gaps in the crossbar of the figure-eight, said secondary conductive films being connected in parallel.

25. The transformer of claim 24 wherein adjacent layers of said stack are insulated from each other by a dielectric material disposed therebetween.

26. The transformer of claim 24 wherein adjacent secondary conductive films on said dielectric membrane are disposed so that the potential gradients between the terminals of adjacent turns of said secondary windings in said stack are substantially equal.

27. The transformer of claim 1 wherein said primary winding has substantially one turn per layer and said secondary winding has substantially one turn per layer.

28. A transformer, comprising:
   a dielectric membrane having first and second major surfaces;
   a primary winding comprising a primary conductive film disposed on the first and second major surfaces, respectively, of a first portion of said dielectric membrane, each said primary conductive film having a substantially serpentine configuration when disposed in a plane, said primary conductive films on the first and second major surfaces of said dielectric membrane being connected in series at one end to form said primary winding;
   at least one secondary winding, each said secondary winding comprising a plurality of separate secondary conductive films each having a substantially figure-eight configuration with a vertical slit at the horizontal midline thereof, said secondary conductive films being connected in parallel to each other, said secondary winding being disposed on the first major surface of a second portion of said dielectric membrane;
   said dielectric membrane being folded to form a stack of layers having an axis extending substantially longitudinally through said stack, adjacent layers of said stack being insulated from each other by a dielectric material disposed therebetween, said primary winding and said secondary winding each comprising a plurality of turns which encircle said axis and which are interleaved in said stack, said dielectric membrane being folded such that:
   a first fold along a second axis separates the first and second portions of said dielectric membrane so as to place the second major surface on the second portion in contact with the second major surface of the first portion, said primary conductive film on the lower surface of the first portion being insulated from said secondary winding by said dielectric membrane; and further folds of said dielectric membrane along
   axes normal to said second axis occur in an accordion-like manner with successive folds being made in directions opposite to each other.

29. The transformer of claim 28, further comprising a magnetic core, said magnetic core comprising:
   top and bottom magnetic walls disposed respectively adjacent upper and lower surfaces of said stack of layers;
   a central magnetic member extending between said top and bottom walls and through an aperture in said stack; and
   a peripheral magnetic wall extending between said top and bottom walls.

30. A transformer, comprising:
   a dielectric membrane having first and second major surfaces;
   a primary winding comprising a primary conductive film disposed on the first and second major surfaces, respectively, of a first portion of said dielectric membrane, each said primary conductive film having a substantially serpentine configuration along a predetermined direction when disposed in a plane, said primary conductive films on the first and second major surfaces of said dielectric membrane being connected in series at one end to form said primary winding;
   two secondary windings, each said secondary winding comprising a plurality of turns of separate secondary conductive films electrically connected together, said secondary windings being disposed in a second and a third portion of the first major surface of said dielectric membrane, each said secondary conductive film comprising substantially two turns and having substantially figure eight configuration which is disposed normal to the predetermined direction of said primary conductive films, each said secondary conductive film having two end terminals and a center-tapped terminal separated from each other by two insulating gaps in the crossbar of the figure-eight;

said dielectric membrane being folded to form a stack of layers having an axis extending substantially longitudinally through said stack such that first and second folds are made in said dielectric membrane so that said primary winding is disposed between the turns of said secondary windings to form an intermediate stack, and said intermediate stack is folded in an accordion-like manner for which successive folds are made oppositely to each other; and the corresponding terminals of each said secondary conductive film being connected in parallel.

31. The transformer of claim 30 including an additional dielectric material disposed between adjacent layers of said stack so as to insulate said adjacent layers from each other.

32. The transformer of claim 30 wherein adjacent secondary conductive films on said dielectric membrane are disposed so that the potential gradient between the terminals of adjacent turns of said secondary windings in said stack are substantially equal.

33. The transformer of claim 30, further comprising a magnetic core, said magnetic core comprising:
   top and bottom magnetic walls disposed respectively adjacent upper and lower surfaces of said stack of layers;
   a central magnetic member extending between said top and bottom walls and through an aperture in said stack; and
   a peripheral magnetic wall extending between said top and bottom walls.

34. The transformer of claim 3 wherein said secondary conductive films are connected in parallel.

* * * * *

UNITED STATES PATENT AND TRADEMARK OFFICE
CERTIFICATE OF CORRECTION

PATENT NO. : 4,959,630
DATED : September 25, 1990
INVENTOR(S) : Alexander John Yerman and Khai Doan The Ngo It is certified that error appears in the above-identified patent and that said Letters Patent is hereby corrected as shown below:

Claim 2, column 9, line 64, after "uniform", insert -- widths. --.

Signed and Sealed this

Eighteenth Day of October, 1994

Attest:

BRUCE LEHMAN

Attesting Officer

Commissioner of Patents and Trademarks